United States Patent
Albert et al.

(10) Patent No.: US 11,114,601 B2
(45) Date of Patent: Sep. 7, 2021

(54) THERMOELECTRIC MATERIAL

(71) Applicant: TECHNISCHE UNIVERSITÄT DARMSTADT, Darmstadt (DE)

(72) Inventors: Barbara Albert, Darmstadt (DE); Dennis Henge, Darmstadt (DE)

(73) Assignee: Technische Universität Darmstadt, Darmstadt (DE)

(*) Notice: Subject to any disclaimer, the term of this patent is extended or adjusted under 35 U.S.C. 154(b) by 444 days.

(21) Appl. No.: 16/329,022

(22) PCT Filed: Aug. 28, 2017

(86) PCT No.: PCT/EP2017/071570
§ 371 (c)(1),
(2) Date: Feb. 27, 2019

(87) PCT Pub. No.: WO2018/041788
PCT Pub. Date: Mar. 8, 2018

(65) Prior Publication Data
US 2019/0207072 A1    Jul. 4, 2019

(30) Foreign Application Priority Data
Aug. 31, 2016 (DE) .......... 102016116248.5

(51) Int. Cl.
*H01L 35/14* (2006.01)
*C01B 25/08* (2006.01)
*H01L 35/20* (2006.01)

(52) U.S. Cl.
CPC ............ *H01L 35/14* (2013.01); *C01B 25/088* (2013.01); *H01L 35/20* (2013.01);
(Continued)

(58) Field of Classification Search
CPC ....... H01L 35/14; H01L 35/20; C01B 25/088; C01P 2002/54; C01P 2002/88; C01P 2006/32; C01P 2006/40
See application file for complete search history.

(56) References Cited

U.S. PATENT DOCUMENTS 7,728,218 B2   6/2010   Snyder et al.
2011/0020164 A1   1/2011   Stefan et al.
(Continued)

FOREIGN PATENT DOCUMENTS

DE   102011016808 A1   10/2012
DE   102014203176 A1   9/2015
WO   2011012548 A2   2/2011

OTHER PUBLICATIONS

Ponnambalam, V. [et al.]: "High Seebeck coefficient AMXP2 (A=Ca and Yb; M, X=Zn, Cu and Mn) Zintl phosphides as high-temperature thermoe-lectric materials.", In: J. Phys D: Appl. Phys, vol. 44, 2011, No. 15, p. 155406 (pp. 6).
(Continued)

*Primary Examiner* — Andrew J. Oyer
(74) *Attorney, Agent, or Firm* — Hudak, Shunk & Farine Co. LPA

(57) ABSTRACT

Novel compounds with thermoelectric properties are presented. The novel compounds belong to the group of phosphides. They are characterized by excellent thermoelectric properties, in particularly in the temperature range of 400° C. to 700° C. Also a production method for the production of the compounds is presented, with which the thermoelectric substances can be prepared with high yield and quality.

16 Claims, 3 Drawing Sheets

(52) U.S. Cl.
CPC ...... *C01P 2002/54* (2013.01); *C01P 2002/88* (2013.01); *C01P 2006/32* (2013.01); *C01P 2006/40* (2013.01)

(56) References Cited

U.S. PATENT DOCUMENTS

| | | |
|---|---|---|
| 2012/0091404 A1 | 4/2012 | Snyder et al. |
| 2012/0128017 A1 | 5/2012 | Felser et al. |
| 2014/0033703 A1 | 2/2014 | Limbeck et al. |
| 2016/0245556 A1 | 8/2016 | Laemmle et al. |

OTHER PUBLICATIONS

Ponnambalam, V. [et al.]: "Thermoelectric Properties of Light-Element-Containing Zintl Compounds $CaZn_2-xCu_xP_2$ and $CaMnZn_1-xCu_xP_2$ (x=0.0-0.2)", In: J. Electron. Mater., vol. 43, No. 6, 2014, S. 1875-1880.

Guechi, N. [et al.]: "Structural, elastic, electronic and optical properties of the newly synthesized monoclinic Zintl phase $BaIn_2P_2$", In: Solid State Sci., vol. 29, 2014, p. 12-23.

Rauscher, Japheth F, [et al.]:"Flux growth and structure of two com-pounds with the $EuIn_2P_2$ structure type, $AIn_2P_2$ (A=Ca and Sr), and a new structure type $BaIn_2P_2$", In: Acta Cryst., Sect. C, Cryst. Struct. Commun., vol. 65, 2009, No. 10, p. i69-i73.

THERMOELECTRIC MATERIAL

FIELD OF THE INVENTION

The subject matter of this invention is a thermoelectric material, a method for its production and its use.

BACKGROUND OF THE INVENTION

Thermoelectric materials are known from prior art. On the basis of the Seebeck effect they convert heat into electrical energy. So, for example, waste heat in the exhaust gas system of a motor vehicle can be used for saving fuel. But for this inexpensive, non-toxic materials which are as light-weight as possible and which convert heat into electric current in the right temperature range in an as efficient as possible manner are necessary. An ideal thermoelectric substance should not be air- or moisture-sensitive, should have a relatively low density and should be producible from cost-effective raw materials. In addition, the material should have a high Seebeck coefficient, a low electrical resistance and a low thermal conductivity so that a high thermoelectric figure of merit (zT factor) results.

Materials which have been used till today contain elements which are toxic (lead), poorly available and expensive (tellurium, germanium, ytterbium, bismuth) and heavy (bismuth, lead). In the temperature range of 400° C. to 700° C. some Heusler compounds have good thermoelectric properties. However, they consist of exotic, complicated combinations of elements (e.g. hafnium). Some phosphides are known as substance and partially they are also characterized as being thermoelectric. But till today phosphides have not been used as thermoelectric substances, because sufficient thermoelectric properties are not achieved.

So, for example, Ponnambalam et al. (*High Seebeck coefficient AMXP2 (A=Ca and Yb; M, X=Zn, Cu and Mn) Zintl phosphides as high-temperature thermoelectric materials*. In: *J. Phys. D: Appl. Phys.* 44(2011)) describe Zintl phosphides as thermoelectric substances. Phosphides with the stoichiometry AMXP2 with A=Ca and Yb; M, X=Zn, Cu and Mn), namely $CaZn_2P_2$, $YbZn_2P_2$, $YbCuZnP_2$ and $YbMnCuP_2$ were examined. But the phosphides which are described there contain ytterbium which is a very expensive element. On the other hand, at the relevant temperatures the also examined $CaZn_2P_2$ has a very high electrical resistance (100 mΩ*cm at 1000 K) which is absolutely not suitable for thermoelectric applications. Yb is described as necessary for good zT factors. For $YbCuZnP_2$ a zT value of ca. 0.6 was determined. The other compounds have shown considerably poorer results.

U.S. Pat. No. 7,728,218 B2 describes highly efficient thermoelectric Zintl phases. Partially, the materials described there have very high thermoelectric figures of merit. But, due to their content of antimony the materials are questionable with respect to their toxicity. In addition, the materials contain high amounts of ytterbium, so that very expensive raw materials have to be used for the production. In addition, in the document is shown that the described materials only at a relatively high temperature reach the described figures of merit. In addition, the compounds described there have relatively high densities which are nearly twice as high as the densities of the compounds according to the present invention. High densities are a barrier to industrial use, since more material on the same area is required. Especially in the temperature range of higher than 400° C. (in particularly up to 700° C.) there is a lack of suitable thermoelectric materials, in particularly of ones with low density.

SUMMARY OF THE INVENTION

Consequently, there is a demand for thermoelectric materials which combine a high Seebeck coefficient, low thermal conductivity and low electrical resistance with non-toxic ingredients, low density and cost-effective raw materials. In addition, at mid-level (e.g. for motor vehicles) and high-level temperatures of above 400° C. the materials should have good thermoelectric properties.

Solution

This object is solved by the subject matter of the patent claims.

Material

The invention relates to a thermoelectric material having the formula $R_{1-x}Mn_xCuP$ wherein x is at least 0.01 and at most 0.99 and R is selected from magnesium, calcium, strontium, barium and mixtures thereof.

It has been shown that examples of this material class are not only less air- and moisture-sensitive, but also, in comparison to the thermoelectric materials of prior art, have a low density and achieve high thermoelectric figures of merit in the temperature range of 400° C. to 700° C. Till today these materials have not been known in prior art.

It has been found that the thermoelectric properties of the material can be improved further, when x is not higher than 0.5, in particularly not higher than 0.3 or not higher than 0.2. Further improvements can be achieved, when x is at least 0.02, more preferably at least 0.03 and particularly preferably at least 0.08. In particularly, x is preferably 0.02 to 0.5; preferably 0.03 to 0.3 and particularly preferably 0.03 to 0.2.

When R was magnesium, then the best results were achieved. Particularly preferable compounds of this invention are $Mg_{0.9}Mn_{0.1}CuP$, $Mg_{0.85}Mn_{0.15}CuP$ and $Mg_{0.8}Mn_{0.2}CuP$.

In preferable embodiments the mentioned compounds in a temperature range starting at 400° C. (in particularly up to 700° C.) achieve a thermoelectric figure of merit of at least 0.4, in particularly at least 0.6, preferably at least 0.7. In preferable embodiments the Seebeck coefficient of the materials in a temperature range starting at 400° C. (in particularly up to 700° C.) is at least 80 µV/K, in particularly at least 120 µV/K, further preferably at least 140 µV/K and particularly preferably at least 160 µV/K in a temperature range starting at 400° C. up to 700° C. Preferably, at 20° C. the density of the materials is lower than 5.5 g/cm³, in particularly lower than 4.8 g/cm³ and preferably lower than 4.7 g/cm³. In particularly, the mentioned features also apply to molded articles prepared from said material which are also according to the present invention. Thus, the thermoelectric substances of this invention are more light-weight than a lot of materials of prior art. Furthermore, the raw materials used, namely the alkaline-earth metals (without barium), manganese, copper and phosphorus are characterized by a relatively low toxicity.

Preferably, in the temperature range starting at 400° C. (in particularly up to 700° C.) the material according to the present invention has thermal conductivities of at most 3.5 W/mK, in particularly at most 2.5 W/mK, preferably at most 2.4 W/mK and particularly preferably at most 2.3 W/mK. Low thermal conductivities are an essential feature for thermoelectric substances. In the temperature range starting at 400° C. (in particularly up to 700° C.) the electric conductivities of the materials according to the present invention are preferably at least 250 S/cm, preferably at least 350 S/cm, in particularly at least 400 S/cm, more preferably at least 450 S/cm and particularly preferably at least 500 S/cm. A high electric conductivity makes a contribution to good thermoelectric properties. A small band gap results in good thermoelectric properties. The materials according to the present invention have band gaps, starting at 450° C. which are in particularly lower than 0.5 eV, in particularly lower than 0.3 eV, preferably lower than 0.2 and particularly preferably lower than 0.13 eV.

The materials of this invention are preferably free of Pb, Bi, Hf, Ge, Te and Yb. In particularly, the materials are preferably free of components which are not mentioned here as a constituent. When in this description is mentioned that the materials are free of one component or that they do not contain a special component, then this means that it is only allowed for this component to be present as an impurity in the materials. This means that it is not added in substantial amounts. According to the present invention, non-substantial amounts are amounts of less than 100 ppm (w/w), preferably less than 50 ppm and most preferably less than 10 ppm.

A molded article which comprises the material according to the present invention or which substantially consists of this material is also according to the present invention. In particularly, the molded article has a density which corresponds to at least 90%, preferably at least 95% of the theoretical, crystallographic density of the material according to the present invention. Preferably, the molded article consists of a material which comprises at least 90% (w/w), preferably at least 94%, more preferably at least 95% material according to the present invention.

A thermoelectric generator which comprises a material and/or a molded article of this invention is also according to the present invention. Thermoelectric generators consist of several components and are used for converting the thermal energy from a heat transfer fluid into electrical energy. A heat source, e.g. a combustion engine or a heating system, with a heat transfer fluid with an inlet and an outlet for the heat transfer fluid transfers via heat exchangers the thermal energy to thermoelectric elements. On the opposite side with respect to the heat source, on the other side of the thermoelectric element, with a cooling facility with a cooling fluid and an inlet and an outlet for the cooling fluid via heat exchangers thermal energy is extracted. Due to the Seebeck effect the temperature gradient results in a potential which through current-carrying conductors can be fed as electrical energy into appliances (e.g. in the car). Normally, in the automobile a tube in the exhaust gas system serves as a heat source and combustion gases as heat transfer fluids, wherein the cooling can be achieved e.g. by a water circulation or through air. In this case the thermoelectric elements can be arranged in plates, wherein through them the thermoelectric elements are in contact with a heat transfer fluid and a cooling fluid each and thus can be extended in a "modular manner".

The thermoelectric generator according to the present invention in particularly comprises the following: a thermoelectric element, an inlet and an outlet for a heat transfer fluid for heating one side of the thermoelectric element, an inlet and an outlet for a cooling fluid for cooling another side of the thermoelectric element, and at least one current-carrying conductor for feeding the obtained electrical energy into an appliance.

In this manner a heat transfer fluid, in particularly mediated by a heat exchanger, can transfer thermal energy to one side of the thermoelectric element. A cooling fluid, on another side of the thermoelectric element, in particularly via a heat exchanger, can extract thermal energy from the system. The thermoelectric element comprises the thermoelectric material of this invention. The thermoelectric generator may comprise several thermoelectric elements.

In particularly, the thermoelectric generator can be used in a motor vehicle. But also other possible applications are according to the present invention. Preferably, the thermoelectric generator is arranged in the longitudinal direction of the flow direction of the fluids. In this case the integration in seals and electrical isolation material which are stable in the temperature range with respect to the ambient conditions and the thermoelectric material is preferred. The thermoelectric elements should also be linked by electric contactors which are stable in the temperature range with respect to the thermoelectric material and which do not diffuse into the molded article.

Method

A method for the production of a thermoelectric material of this invention is also according to the present invention. The method comprises the following steps: providing the elements R, manganese, copper and phosphorus in a reaction vessel, evacuating the reaction vessel, heating the reaction vessel to a temperature of higher than 700° C., in particularly higher than 750° C., removal of the reaction product.

It has been shown that it is possible with the mentioned methods to produce the thermoelectric materials according to the present invention in good quality and high yield. For compensating an optional loss of the alkaline-earth metal due to evaporation, preferably, R is used in an excess of 2% to 20%, relative to the amount being necessary with respect to stoichiometry.

In a preferable embodiment prior to the step of heating the reaction vessel is preheated to an increased temperature which is lower than the temperature during the step of heating. During the preheating step the reaction vessel is preferably preheated to a temperature of at least 300° C., in particularly at least 350° C. The temperature during the preheating step is preferably limited to at most 600° C., in particularly at most 500° C. or at most 450° C. The temperature is preferably maintained for a duration of at least 10 hours, in particularly at least 20 hours and particularly preferably at least 30 hours. Preferably, the temperature is maintained for a period of time of no longer than 150 hours, in particularly no longer than 80 hours and particularly preferably no longer than 50 hours. The preheating is in particularly realized with a heating rate of at least 20° C./h, more preferably at least 30° C./h and particularly preferably at least 40° C./h. But, preferably, the heating rate should not exceed a rate of 250° C./h, in particularly 150° C. and particularly preferably 80° C./h. The preheating step results in the fact that the elements already partially react at low temperatures, for limiting the "loss" of e.g. magnesium at higher temperatures. Furthermore, the element phosphorus should form phosphides with the other elements already at these low temperatures, if possible. In sum, so the synthesis of secondary phases (compounds which are not desired, in the case of MgCuP e.g. $Cu_3P$ and $Mg_3P_2$) should be prevented.

Preferably, in the step of heating the reaction vessel is not heated to a temperature of higher than 1100° C., in particularly higher than 1000° C., higher than 900° C. or higher than 850° C. When the temperatures are too high, then undesired by-products are formed. For guaranteeing a complete reaction of the raw materials, it has been shown to be advantageous to maintain the mentioned high temperature for a duration of at least 30 hours, in particular at least 40 hours or at least 50 hours. Preferably, the temperature is not maintained for a period of time of longer than 250 hours, in particularly longer than 150 hours and particularly preferably longer than 100 hours. The heating is in particularly realized with a heating rate of at least 20° C./h, more preferably at least 30° C./h and particularly preferably at least 40° C./h. But, preferably, the heating rate should not exceed a rate of 250° C./h, in particularly of 150° C. and particularly preferably of 80° C./h. When the mentioned conditions are not fulfilled, then there is the risk that secondary phases are formed. In the case of high temperatures there is the risk that the compound is decomposed in vacuum into e.g. $Cu_3P$, or other compounds. When the temperatures are too low, then the reaction does not completely proceed to the desired product, and e.g. elementary copper remains in the reaction mixture, wherein the same is true, when the reaction time is too short. When the reaction time is too long, then it may be possible that the compound is decomposed gradually (similarly to the case of a temperature which is too high). In the case of a heating rate which is too high secondary phases may occur, since e.g. the elements magnesium and phosphorus evaporate, before they can react.

After the step of heating, in particular, a step of cooling follows. Preferably, the cooling is realized with a cooling rate of not higher than 1000° C./h, preferably not higher than 500° C./h, more preferably not higher than 300° C. and particularly preferably not higher than 150° C./h. Preferably, the cooling rate is at least 10° C./h, more preferably at least 30° C./h, further preferably at least 50° C./h and particularly preferably at least 70° C./h. When the cooling rate is too high, then the product is not highly crystalline, which complicates the identification of optionally present secondary phases by means of X-ray diffraction. When the cooling rate is too low, then this results in a considerable increase of the reaction time.

Optionally, after the removal of the reaction product a step of comminuting, e.g. grinding, of the reaction product follows. After the step of comminuting from the reaction product a molded article can be prepared. Therefore, a further optional step after the removal and/or after the comminution of the reaction product is the compaction of the reaction product to a molded article. Preferably, the molded article has a density which amounts to at least 90%, in particular at least 95% of the theoretical, crystallographic density of the material. It has been shown that the thermoelectric material of this invention, also in the case of compaction, does not suffer from changes in crystal structure so that it can be processed into molded articles very well.

The compaction can in particular be realized by means of SPS (spark plasma sintering), but also other methods which are known by a person skilled in the art are possible. Preferably, after the removal and optionally after the comminution, the reaction product is transferred into a mold, e.g. a female graphite mold. Preferably, the reaction product is heated in the mold to a temperature of at least 300° C., in particularly at least 350° C. The temperature during the heating step is preferably limited to at most 600° C., in particularly at most 500° C. or at most 450° C. In particularly, the heating is realized with a heating rate of at least 20° C./h, more preferably at least 30° C./h and particularly preferably at least 40° C./h. But the heating rate should preferably not exceed a rate of 250° C./h, in particularly 150° C. and particularly preferably 80° C./h. The compaction, in particular after the heating step, is realized by pressing with a pressure of preferably at least 10 MPa, in particularly at least 20 MPa and preferably at least 25 MPa. But the pressure should not exceed a value of 150 MPa, preferably a value of 100 MPa and particularly preferably a value of 50 MPa. Preferably, during the pressing step the heating is maintained, in particular to a temperature of at least 500° C., in particular at least 610° C. Preferably, the temperature during the step of pressing is limited to at most 850° C., in particular at most 800° C. or at most 750° C. This temperature is maintained during the step of pressing for a duration of in particularly at least 10 minutes, preferably at least 20 minutes and particularly preferably at least 25 minutes. Preferably, this temperature is maintained for a duration which is not longer than 2 hours, in particular not longer than 1 hour and particularly preferably not longer than 45 minutes. Subsequently, the obtained molded article is cooled, in particularly without further exertion of pressure. It has been shown that it is possible that the molded articles shatter, when during the cooling step pressure is further exerted. When the work is conducted at a temperature which is too low or when the compacting time is too short, then the compaction is not high enough, i.e. the molded article is characterized by a density which is lower than 90% of the theoretical, crystallographic density. Sometimes, the molded article is not stable and breaks into smaller parts. When the work under pressure is conducted at a temperature which is too high, then partially secondary phases were formed. The mold may be a hollow cylinder, in particular with two preferably precisely fitting dies.

With the production method according to the present invention the material according to the present invention can be obtained with high yield and purity. The product of the method in particular consists of at least 90% (w/w), preferably of at least 94%, more preferably of at least 95% of the material according to the present invention.

Use

Also the use of the material described here as a thermoelectric substance is according to the present invention. This includes the use of the material in a thermoelectric generator. In preferable embodiments the material is used as a thermoelectric substance for obtaining electrical energy from waste heat, in particularly in a motor vehicle (e.g. in the exhaust gas system).

BRIEF DESCRIPTION OF THE DRAWINGS

Shown are in

DETAILED DESCRIPTION OF THE INVENTION

Examples

Figure 1:
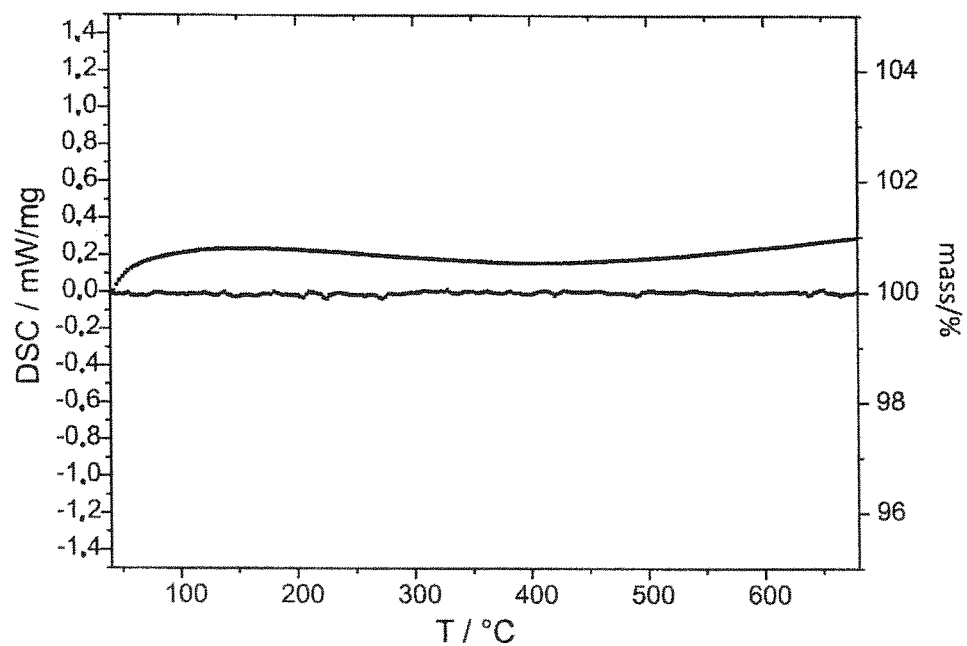
FIG. 1 shows the result of a DSC/TG measurement on $Mg_{0.90}Mn_{0.10}CuP$.

Synthesis and Characterization by X-Ray Diffraction Analysis

All compounds discussed here were synthesized in evacuated quartz glass ampoules with internal corundum crucibles. The elements magnesium, manganese, copper and phosphorus were weighed in in the ratio of $(1.15-x):x:1:1$ ($x=0.05; 0.1; 0.15; 0.2$) and transferred in the countercurrent argon flow into the internal crucible in a semi-ampoule which has been baked out in advance. An excess of magnesium was used, because at the reaction temperature magnesium volatilizes and forms a light precipitate on the quartz glass wall of the ampoule. The weighed portions of the elements for the ternary and the quaternary compounds can be found in Table 1. All batches were calculated such that ca. one gram of the desired product each was obtained.

TABLE 1

| Target compound | m Mg/g | m Mn/g | m Cu/g | m P/g |
|---|---|---|---|---|
| MgCuP | 0.2054 | 0 | 0.5438 | 0.2608 |
| $Mg_{0.95}Mn_{0.05}CuP$ | 0.2285 | 0.024 | 0.5434 | 0.2668 |
| $Mg_{0.90}Mn_{0.10}CuP$ | 0.193 | 0.043 | 0.5055 | 0.2463 |
| $Mg_{0.85}Mn_{0.15}CuP$ | 0.2018 | 0.0646 | 0.5065 | 0.2439 |
| $Mg_{0.80}Mn_{0.20}CuP$ | 0.1933 | 0.0988 | 0.5613 | 0.2742 |

The evacuated ampoules were sealed and subjected to a temperature program in a tubular furnace. At first, with 50° C./h it was heated to 400° C., and this temperature was maintained for 36 hours, subsequently with 50° C./h it was heated to 850° C., and this temperature was maintained for 72 hours, and then it was cooled to room temperature with a cooling rate of 100° C./h. Temperatures of higher than 850° C. resulted in the formation of $Cu_3P$ and $Mg_3P_2$ as secondary phases. A larger excess of magnesium resulted in the formation of $Mg_2Cu$. It has been shown that the obtained preparations of $Mg_{1-x}Mn_xCuP$ were not air- or humidity-sensitive.

All products were ground and analyzed by powder diffractometry ($CuK\alpha,1$ radiation). On the basis of the known structure model of MgCuP for all compounds Rietveld adjustments were conducted. Substituted products with x=0.05; 0.10 and 0.15 were obtained nearly phase-pure with only low proportions of secondary phases. In the case of a substitution of Mn for Mg with x=0.20 multiphase products with higher proportions of $Cu_3P$ as a secondary phase were obtained.

Compaction

For the mixed crystal series $Mg_{1-x}Mn_xCuP$ the compaction was conducted with the help of SPS. Ca. 0.6 to 0.8 g of the samples each were finely pulverized and placed in a female graphite mold with an inner diameter of 10 mm. The pressing parameters were determined by a plurality of experiments.

Highly compacted test pieces were obtained as follows. At first, without pressure with ca. 50° C./min it was heated to ca. 400° C. Then a pressure of 30 MPa (corresponds to 2.3 kN) was applied and it was further heated. At 650° C. the pressure was increased to 50 MPa (corresponds to 3.7 kN), and at constant temperature it was maintained for a period of time of half an hour. After the completion of the compaction and the shutdown of the power of the SPS apparatus no pressure was applied onto the test piece. In the context of this work in many compaction experiments was found that it is possible that the test pieces of intermetallic phases break, when during the cooling phase pressure is applied onto them.

After the samples had been cooled down, the female graphite molds were removed. With the help of a bench vise the samples were removed from the female molds, because it was difficult to loosen them from the female graphite mold. Thoroughly the compacted test pieces were mechanically treated with sand paper for removing optionally present graphite and for guaranteeing a good contact of the test pieces in the apparatuses for the determination of the thermoelectric properties. The densities of the samples were determined by pycnometry. Here, values of >95% of the theoretical, crystallographic density were measured.

The obtained compacted test pieces of the solid solution $Mg_{1-x}Mn_xCuP$ were analyzed with X-ray diffraction in reflection for examining, whether the compaction had changed the sample. Diffractograms have shown that no changes in crystal structure had been caused by the compaction. After the compaction the samples have shown no change in identity.

Thermal Analysis

The compound $Mg_{0.90}Mn_{0.10}CuP$ was analyzed thermoanalytically by means of DSC/TG (FIG. 1). The measurement was performed under argon in platinum crucibles with internal corundum crucibles at temperatures of 25° C. to 700° C. with a heating rate of 10° C./min. No changes of the mass or peaks which are indicative for a physical or chemical conversion of the compound can be seen. Thus, the compound is thermostable.

Energy Dispersive Spectroscopy

Compacted test pieces of the compounds MgCuP, $Mg_{0.90}Mn_{0.10}CuP$, $Mg_{0.85}Mn_{0.15}CuP$ and $Mg_{0.80}Mn_{0.20}CuP$ were analyzed by means of energy dispersive X-ray spectroscopy with respect to their composition and the distribution of the elements. The measurements have shown that the substitution of manganese for magnesium has resulted in a lower proportion of manganese as was envisaged by the weighed portion. In table 2 the proportions measured by means of energy dispersive spectroscopy (EDS) in comparison to the proportions envisaged by the weighed portion are listed. For all compounds a lower proportion of manganese as was envisaged by the weighed portion was measured each. This is consistent with the lattice parameters and the population factors which were determined by means of the Rietveld method. The reason for this is that the ratio of the weighed portions between magnesium and manganese was not an ideal one; an excess of magnesium was used, because magnesium partially volatilizes during the reaction. Therefore, the ratio between magnesium in the case of the intended compound $Mg_{0.90}Mn_{0.10}CuP$ is not exactly 0.9 to 0.1.

TABLE 2

| Ideal | x (EDS) |
|---|---|
| $Mg_{0.90}Mn_{0.10}CuP$ | 0.089 |
| $Mg_{0.85}Mn_{0.15}CuP$ | 0.101 |
| $Mg_{0.80}Mn_{0.20}CuP$ | 0.182 |

Thermoelectric Characterization

All synthesized and compacted compounds in the system $Mg_{1-x}Mn_xCuP$ were characterized thermoelectrically. The measurements of the Seebeck coefficients and the electric conductivities were conducted simultaneously from 50° C. to 650° C. or 800° C. In a further measurement the temperature and thermal conductivities were determined with the laser flash method.

Figure 2:
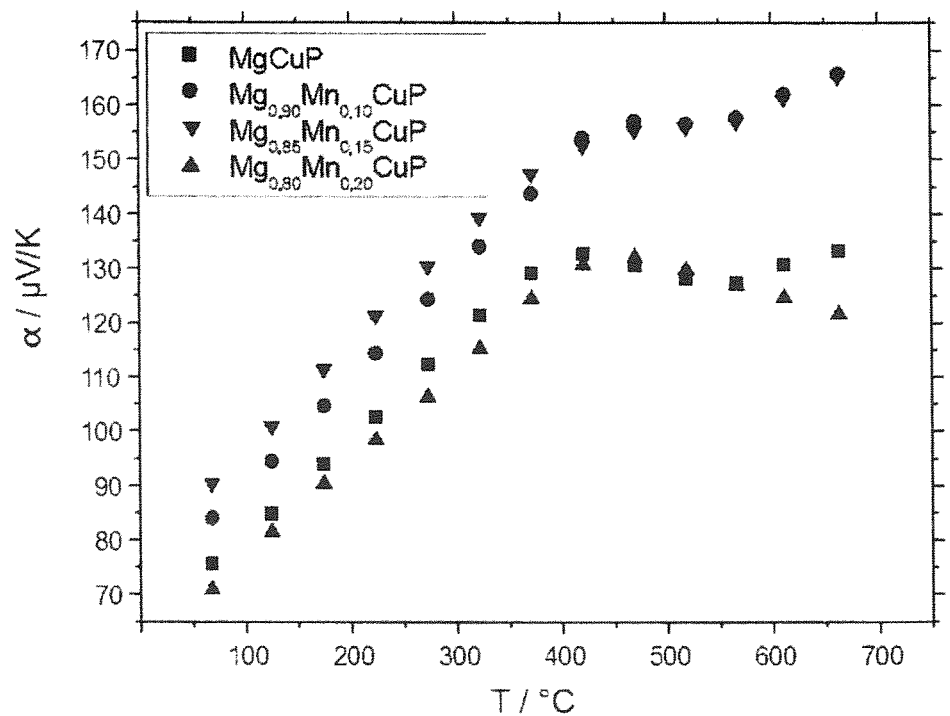
FIG. 2 shows the Seebeck coefficients of the synthesized compounds as a function of the temperature.

The measurements of the Seebeck coefficients (FIG. 2) show that MgCuP and the quaternary compounds are p-thermoelectric substances. The course of the Seebeck coefficients is similar for all compounds. At first, the Seebeck coefficients strongly increase up to ca. 450° C. At higher temperatures differences for the different compounds can be seen. $Mg_{0.90}Mn_{0.10}CuP$ and $Mg_{0.85}Mn_{0.15}CuP$ show further increasing Seebeck coefficients without a maximum and with a value of 165 µV/K at 680° C. For MgCuP and $Mg_{0.90}Mn_{0.20}CuP$ decreasing Seebeck coefficients can be seen. But in the case of MgCuP the Seebeck coefficient again increases at temperatures of higher than 600° C.

Figure 3:
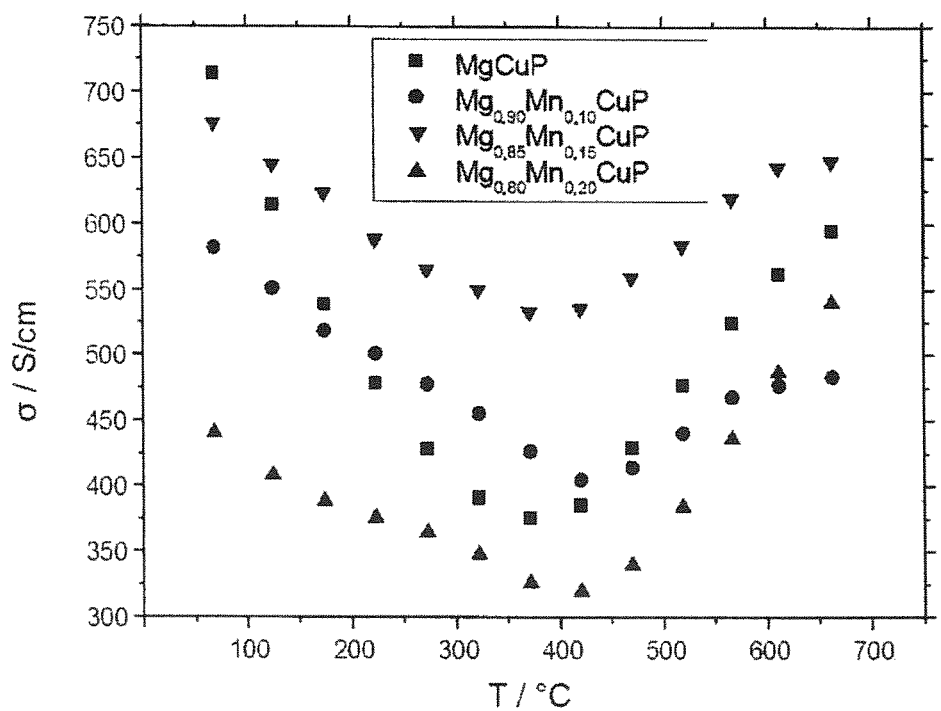
FIG. 3 shows the electric conductivity of the synthesized compounds as a function of the temperature.

The changes in the course of the Seebeck coefficients at 550° C. correspond with the course of the electric conductivities. At low temperatures of up to ca. 300° C. all compounds show metallic behavior. Then, in a range of between 300° C. and 400° C. all compounds show a transition from metallic behavior to semiconductor behavior. This is shown in FIG. 3. The electric conductivities of different samples show a similar course. The proportion of manganese in $Mg_{1-x}Mn_xCuP$ does not correspond with the values of the electric conductivities.

With an Arrhenius plot of the natural logarithms of the electric conductivities against the reciprocal temperature the band gaps of the compounds in the temperature range starting at 450° C. were determined (table 3). $Mg_{0.90}Mn_{0.10}CuP$ and $Mg_{0.85}Mn_{0.15}CuP$ are characterized by band gaps of ca. 0.1 eV which are lower than the band gaps of MgCuP and $Mg_{0.80}Mn_{0.20}CuP$.

TABLE 3

| Ideal | Band gap/eV |
| --- | --- |
| MgCuP | 0.2 |
| $Mg_{0.90}Mn_{0.10}CuP$ | 0.1 |
| $Mg_{0.85}Mn_{0.15}CuP$ | 0.09 |
| $Mg_{0.80}Mn_{0.20}CuP$ | 0.28 |

Figure 4:
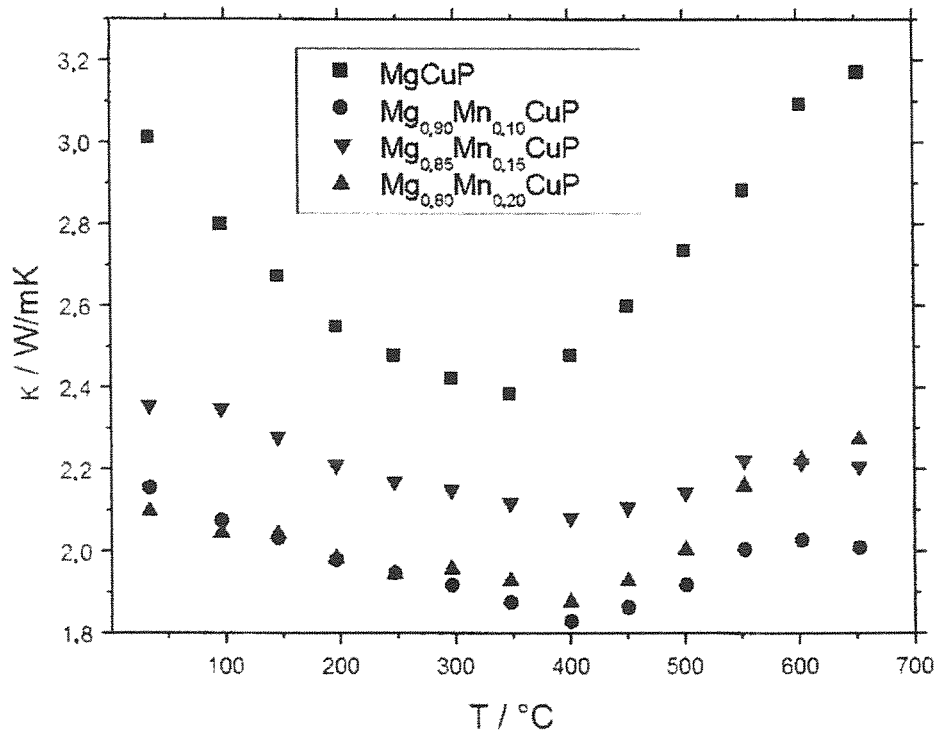
FIG. 4 shows the thermal conductivity of the synthesized compounds as a function of the temperature.

The thermal conductivities of $Mg_{1-x}Mn_xCuP$ were calculated on the basis of the thermal capacities of $Mg_{0.90}Mn_{0.10}CuP$ which were measured by means of DSC (FIG. 4). All compounds show considerable changes at a temperature of ca. 400° C. Up to 400° C. the thermal conductivities decrease, above 400° C. the thermal conductivities increase. MgCuP with values of 2.4 to 3.2 W/mK shows the highest thermal conductivities. $Mg_{0.90}Mn_{0.10}CuP$ and $Mg_{0.85}Mn_{0.15}CuP$ have the lowest values which above 600° C. are approximately constant. The substitution of Mn for Mg has resulted in lower thermal conductivities.

Figure 5:
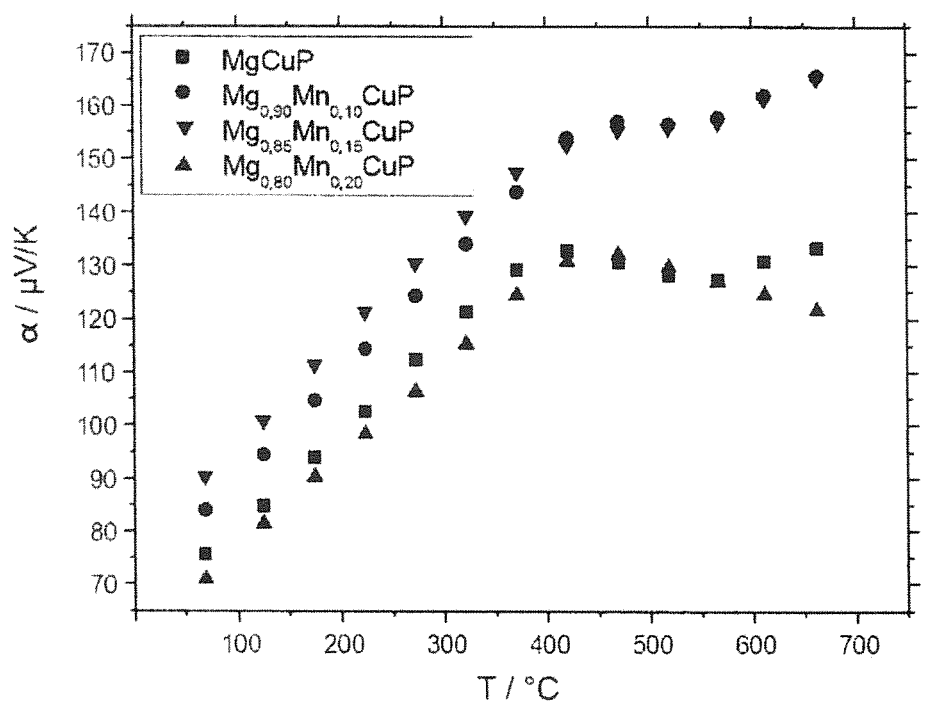
FIG. 5 shows the zT factors of the synthesized compounds as a function of the temperature.

The high Seebeck coefficients, the relatively high electric conductivities and the low thermal conductivities result in high thermoelectric figures of merit (zT factors) which increase with the temperature (FIG. 5). The zT factors of all compounds do not show a maximum. MgCuP and $Mg_{0.80}Mn_{0.20}CuP$ have zT values of ca. 0.3 at 650° C. With the substitution of Mn for Mg a significant improvement of the thermoelectric properties was achieved. $Mg_{0.90}Mn_{0.10}CuP$ and $Mg_{0.85}Mn_{0.15}CuP$ with zT values of higher than 0.6 have factors of merit which are comparable with the zT values of the best phosphides described in literature till today.

What is claimed is:

1. A thermoelectric material with the formula $R_{1-x}Mn_xCuP$, wherein x is at least 0.01 and at most 0.99 and R is selected from Mg, Ca, Ba, Sr and mixtures thereof.

2. The material according to claim 1, wherein x is not higher than 0.5.

3. The material according to claim 1, wherein x is at least 0.02.

4. The material according to claim 1, wherein R=Mg.

5. A method for the production of the material according to claim 1, comprising the following steps:
   providing the elements R, manganese, copper and phosphorus in a reaction vessel,
   evacuating the reaction vessel,
   heating the reaction vessel to a temperature of higher than 700° C.,
   removal of the reaction product.

6. The method according to claim 5, with the further step of comminuting the reaction product, subsequent to the removal.

7. The method according to claim 5, wherein the reaction vessel is not heated to above 1000° C.

8. The method according to claim 5, wherein the reaction vessel is maintained at a temperature of higher than 700° C. for a period of time of at least 50 hours and at most 100 hours.

9. The method according to claim 5, with the further step of compacting the reaction product to a molded article, subsequently to the removal.

10. A use of a material according to claim 1 as thermoelectric substance.

11. The material according to claim 2, wherein x is not higher than 0.3.

12. The material according to claim 11, wherein x is not higher than 0.2.

13. The material according to claim 3, wherein x is at least 0.03.

14. The material according to claim 13, wherein x is at least 0.08.

15. The method according to claim 7, wherein the reaction vessel is not heated to above 850° C.

16. The method according to claim 6, wherein the comminuting is by grinding.

\* \* \* \* \*